(12) United States Patent
Ozawa et al.

(10) Patent No.: US 10,128,324 B2
(45) Date of Patent: Nov. 13, 2018

(54) METHOD OF MANUFACTURING DISPLAY UNIT WITH A SECOND ELECTRODE FORMED TO EXTEND ACROSS A BEZEL REGION

(71) Applicant: JOLED Inc., Tokyo (JP)

(72) Inventors: Nobuo Ozawa, Kanagawa (JP);
Shinichiro Morikawa, Kanagawa (JP);
Teiichiro Nishimura, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 15/797,300

(22) Filed: Oct. 30, 2017

(65) Prior Publication Data

US 2018/0053818 A1 Feb. 22, 2018

Related U.S. Application Data

(62) Division of application No. 14/745,841, filed on Jun. 22, 2015, now Pat. No. 9,831,296.

(30) Foreign Application Priority Data

Dec. 3, 2014 (JP) ................................ 2014-244946

(51) Int. Cl.
*H01L 27/32* (2006.01)
*H01L 51/52* (2006.01)

(52) U.S. Cl.
CPC ...... *H01L 27/3276* (2013.01); *H01L 51/5246* (2013.01)

(58) Field of Classification Search
None
See application file for complete search history.

(56) References Cited

U.S. PATENT DOCUMENTS

| 6,626,721 | B1 * | 9/2003 | Van Slyke | .......... H01L 27/3283 313/504 |
| 7,795,616 | B2 | 9/2010 | Yamazaki et al. | |
| 9,831,296 | B2 | 11/2017 | Ozawa et al. | |
| 2002/0012083 | A1 | 1/2002 | Tanaka et al. | |

(Continued)

FOREIGN PATENT DOCUMENTS

JP 2014-44793 A 3/2014

OTHER PUBLICATIONS

Japanese Office Action dated Jun. 26, 2018 in connection with Application No. 2014-244946.

*Primary Examiner* — Lex Malsawma
(74) *Attorney, Agent, or Firm* — Wolf, Greenfield & Sacks, P.C.

(57) ABSTRACT

A display unit includes a display panel including a display region and a terminal region on a first substrate, the display region including a plurality of pixels, each of the plurality of pixels including a light emitting element, and the terminal region including a plurality of terminals at a part of a peripheral region of the display region. The light emitting element includes a first electrode, an organic layer, and a second electrode that is provided commonly to the plurality of pixels, in order from the first substrate side. The second electrode extends, continuously in a plan view, to an end of the first substrate in a region on the first substrate except for the terminal region, and is configured to be electrically disconnected from an exterior member of the display panel.

11 Claims, 12 Drawing Sheets

(56) References Cited

U.S. PATENT DOCUMENTS

| | | | |
|---|---|---|---|
| 2002/0024096 A1 | 2/2002 | Yamazaki et al. | |
| 2003/0020181 A1* | 1/2003 | Yamada | H01L 51/524 257/787 |
| 2004/0137142 A1* | 7/2004 | Nishikawa | H01L 27/3276 427/66 |
| 2004/0209442 A1* | 10/2004 | Takakuwa | H01L 27/1214 438/458 |
| 2005/0189878 A1 | 9/2005 | Shitagami et al. | |
| 2005/0247938 A1 | 11/2005 | Okamoto et al. | |
| 2007/0013629 A1 | 1/2007 | Matsumoto | |
| 2009/0268145 A1 | 10/2009 | Anjo et al. | |
| 2011/0127556 A1 | 6/2011 | Lee et al. | |
| 2011/0260204 A1* | 10/2011 | Akagawa | H01L 27/3246 257/99 |
| 2012/0199477 A1* | 8/2012 | Uenosono | C23C 14/50 204/298.15 |
| 2015/0036094 A1* | 2/2015 | Lee | G02F 1/1333 349/158 |
| 2015/0171151 A1 | 6/2015 | Chae | |
| 2015/0207100 A1 | 7/2015 | Saito et al. | |
| 2016/0163777 A1 | 6/2016 | Ozawa et al. | |

* cited by examiner

METHOD OF MANUFACTURING DISPLAY UNIT WITH A SECOND ELECTRODE FORMED TO EXTEND ACROSS A BEZEL REGION

CROSS REFERENCE TO RELATED APPLICATIONS

This application is a divisional claiming the benefit under 35 U.S.C. § 120 of U.S. application Ser. No. 14/745,841, entitled "DISPLAY UNIT, METHOD OF MANUFACTURING DISPLAY UNIT, AND ELECTRONIC APPARATUS," filed on Jun. 22, 2015, which claims the benefit of Japanese Priority Patent Application JP 2014-244946 filed Dec. 3, 2014, each of which is incorporated herein by reference.

BACKGROUND

The present disclosure relates to a display unit including a light emitting element such as an organic electroluminescence (EL) element, to a method of manufacturing such a display unit, and to an electronic apparatus including such a display unit.

In a display unit using a light emitting element such as an organic EL element, typically, an interlayer insulating film (an organic insulating film) is so provided as to cover a thin film transistor (TFT). The organic insulating film allows water to easily pass therethrough. Therefore, moisture infiltrates through the organic insulating film from outside, which causes deterioration of an organic layer of the organic EL element. This results in deterioration of light emission luminance or light emission defect such as occurrence of dark spots, which may cause degradation of reliability with time.

Therefore, an organic EL display unit having a structure in which a separation groove is provided on the organic insulating film as described above to separate the organic insulating film into a display region and an outer region, or a structure in which an end of the organic insulating film is selectively removed to separate the organic insulating film into the display region and the outer region, in a peripheral region (a bezel region) of the display region, has been proposed (For example, Japanese Unexamined Patent Application Publication Nos. 2004-281380, 2006-54111, 2008-283222, 2012-150901). By these methods, diffusion of moisture from outside to the display region through the organic insulating film is suppressed.

SUMMARY

However, in the element structure described in the above-described patent literatures, a second electrode (a cathode electrode) of the organic EL element is formed of a metal easily deteriorated by moisture, such as magnesium (Mg), calcium (Ca), and sodium (Na), or an alloy including such a metal. Therefore, the second electrode is provided in a predetermined region in order not to be deteriorated by moisture diffused through the organic insulating film or external environment of the display unit. For example, the second electrode may be provided inside the above-described separation groove of the organic insulating film or inside a region selectively removed, in order not to be exposed to the panel end surface. Specifically, the second electrode is formed with use of a so-called area mask.

When the area mask is used, a margin (a film formation margin) is secured in consideration of misalignment of the area mask (mask misalignment), leakage of a material, processing accuracy of a taper region or the mask, etc. Therefore, a peripheral region is increased, and it is thus difficult to achieve reduction in size of the bezel, reduction in size of the display panel, or reduction in cost of the display panel.

Accordingly, the second electrode is desirably formed without using the area mask as described above, to achieve an element structure that is adapted to suppress degradation of yield while achieving narrow bezel.

It is desirable to provide a display unit that is adapted to suppress degradation of yield while achieving narrow bezel, a method of manufacturing the display unit, and an electronic apparatus including the display unit.

According to an embodiment of the technology, there is provided a display unit including a display panel including a display region and a terminal region on a first substrate, the display region including a plurality of pixels, each of the plurality of pixels including a light emitting element, and the terminal region including a plurality of terminals at a part of a peripheral region of the display region. The light emitting element includes a first electrode, an organic layer, and a second electrode that is provided commonly to the plurality of pixels, in order from the first substrate side. The second electrode extends, continuously in a plan view, to an end of the first substrate in a region on the first substrate except for the terminal region, and is configured to be electrically disconnected from an exterior member of the display panel.

According to an embodiment of the technology, there is provided an electronic apparatus provided with a display unit. The display unit includes a display panel including a display region and a terminal region on a first substrate, the display region including a plurality of pixels, each of the plurality of pixels including a light emitting element, and the terminal region being provided at a part of a peripheral region of the display region and including a plurality of terminals. The light emitting element includes a first electrode, an organic layer, and a second electrode in order from the first substrate side, the second electrode being provided commonly to the plurality of pixels. The second electrode extends, continuously in a plan view, to an end of the first substrate in a region on the first substrate except for the terminal region, and is configured to be electrically disconnected from an exterior member of the display panel.

In the display unit and the electronic apparatus according to the respective embodiments of the disclosure, the second electrode extends, continuously in a plan view, to the end of the first substrate in the region of the first substrate except for the terminal region. Specifically, in the manufacturing process, for example, the second electrode may be formed without using a film formation mask or with use of a mask that has an opening and selectively shields only the terminal region. Therefore, in the peripheral region except for the terminal region, it is unnecessary to secure the film formation margin in consideration of misalignment of the mask opening position in the formation of the second electrode. On the other hand, it is concerned that electrical short circuit between the second electrode extended to the end of the first substrate and the exterior member of the display panel occurs. However, since the second electrode is so configured as to be electrically disconnected from the exterior member of the display panel, such short circuit is difficult to occur after the display panel is mounted on the exterior member. Therefore, it is unnecessary to secure the film formation margin in the peripheral region on the first substrate in the formation of the second electrode, and therefore, the peripheral region is decreased in size as compared with a case where the second electrode is formed in a selective region with use of a mask.

According to an embodiment of the technology, there is provided a method of manufacturing a display unit. The method includes: forming a display panel including a display region and a terminal region, the display region including a plurality of pixels, each of the plurality of pixels including a light emitting element, and the terminal region including a plurality of terminals at a part of a peripheral region of the display region; and forming, as the light emitting element, a first electrode, an organic layer, and a second electrode on the first substrate, the second electrode being common to the plurality of pixels. The second electrode is formed to extend, continuously in a plan view, to an end of the first substrate in a region on the first substrate except for the terminal region, and is formed to be electrically disconnected from an exterior member of the display panel.

In the method of manufacturing the display unit according to the embodiment of the disclosure, the second electrode is formed to extend, continuously in a plan view, to the end of the first substrate in the region of the first substrate except for the terminal region. In other words, for example, the second electrode is formed without using a film formation mask or with use of a mask that has an opening and selectively shields only the terminal region. Therefore, in the peripheral region except for the terminal region, it is unnecessary to secure the film formation margin in consideration of misalignment of the mask opening position and the like in the formation of the second electrode. On the other hand, it is concerned that electrical short circuit between the second electrode extended to the end of the first substrate and the exterior member of the display panel occurs. However, since the second electrode is so configured as to be electrically disconnected from the exterior member of the display panel, such short circuit is difficult to occur after the display panel is mounted on the exterior member. Accordingly, it is unnecessary to secure the film formation margin in the peripheral region on the first substrate in the formation of the second electrode, and therefore, the peripheral region is decreased in size as compared with the case where the second electrode is formed in a selective region with use of a mask.

In the display unit, the method of manufacturing the display unit, and the electronic apparatus according to the respective embodiments of the disclosure, the second electrode extends, continuously in a plan view, to the end of the first substrate in the region on the first substrate except for the terminal region. In other words, in the peripheral region except for the terminal region, the second electrode is formed without using a mask, and thus it is unnecessary to secure the predetermined film formation margin. Therefore, it is possible to reduce the peripheral region of the first substrate in size. Such a second electrode is exposed to the end surface of the display panel, but the second electrode is so configured as to be electrically disconnected from the exterior member. Therefore, it is possible to suppress occurrence of electrical short circuit, and to suppress degradation of yield after the display panel is mounted on the exterior member. As a result, it becomes possible to suppress degradation of yield while achieving narrow bezel.

Note that the above-described contents are examples of the disclosure. Effects achieved by the disclosure are not limited to those described above, and effects achieved by the disclosure may be effects other than those described above or may further include other effects.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, some embodiments of the disclosure will be described in detail with reference to drawings. Note that description will be given in the following order.
1. First embodiment (an example of a display unit in which an end of a second electrode is covered with a protection film)
2. Second embodiment (an example of a display unit having an inverse-tapered structure in a lower layer of a second electrode)
3. Third embodiment (an example of a display unit in which an outermost end of a second substrate overhangs from an end surface of a second electrode)
4. Modifications (other examples of shapes of an end surface of a substrate)
5. Application example (an example of electronic apparatus)

<First Embodiment>
[Configuration]

Figure 1:
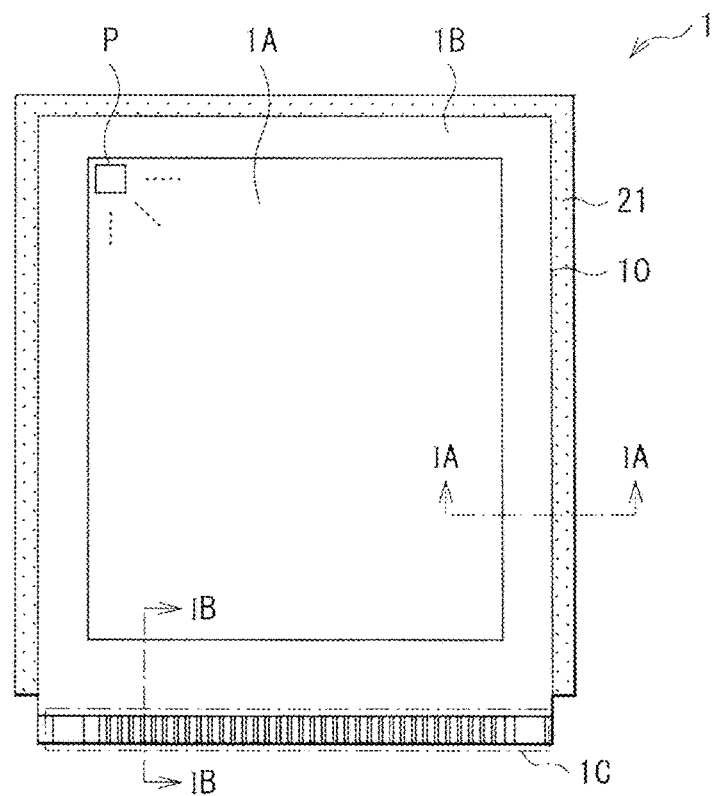
FIG. 1 is a plan view illustrating a configuration of a display unit according to a first embodiment of the disclosure.

FIG. 1 illustrates a planer configuration of a display unit (a display unit 1) according to a first embodiment of the disclosure. The display unit 1 may be, for example, an organic EL display unit, and includes a display panel 10 in a display region 1A on a first substrate (a first substrate 11 described later). The display panel 10 may include, for example, a plurality of pixels (sub-pixels) P that may be arranged in matrix. Each of the pixels P includes an organic EL element, and may emit red light (wavelength of about 620 nm to about 750 nm), green light (wavelength of about 495 nm to about 570 nm), blue light (wavelength of 450 nm to 495 nm), or white light. One pixel is configured of sub-pixels of four colors. A signal line drive circuit, a scan line drive circuit, a power line drive circuit, and the like that are used to drive the pixels P are provided in a peripheral region (a bezel region 1B) of the display region 1A. A terminal part 1C (a terminal region) including a plurality of terminals (terminals 22) for external connection is provided at a part of the bezel region 1B.

Figure 2:
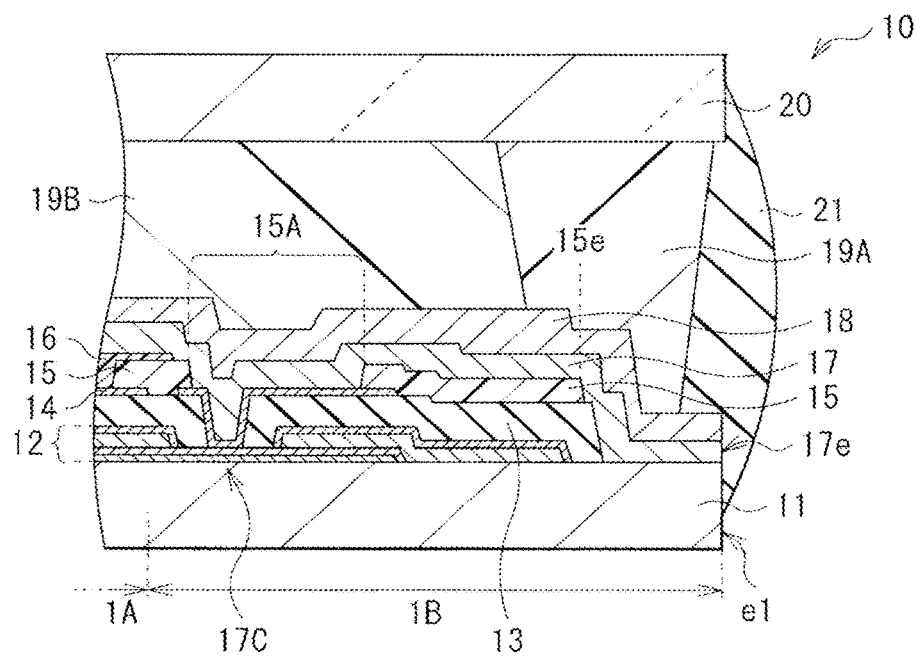
FIG. 2 is a diagram illustrating a sectional structure along IA-IA line illustrated in FIG. 1.
Figure 3:
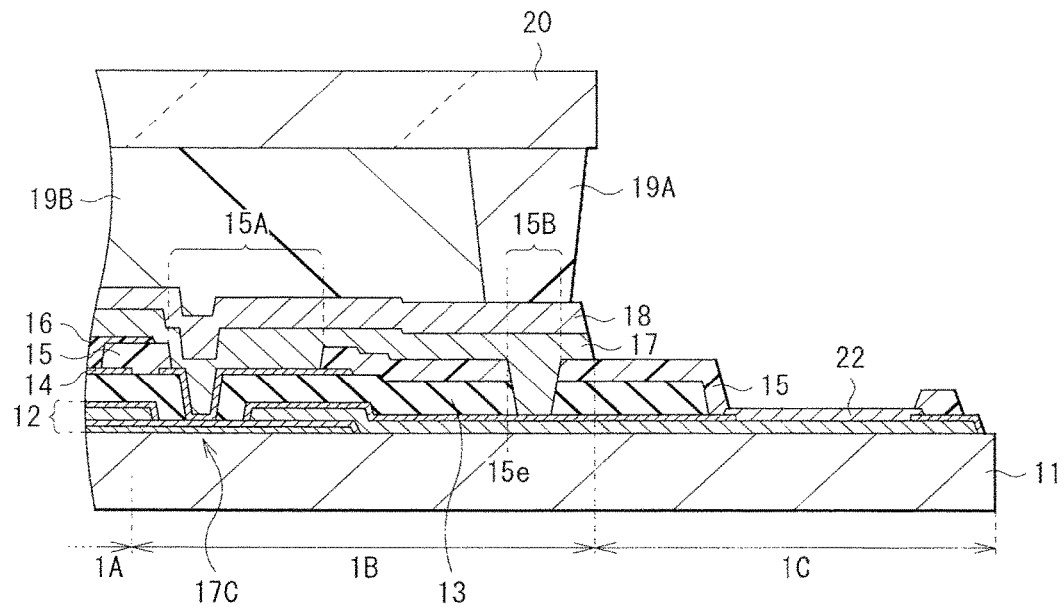
FIG. 3 is a diagram illustrating a sectional structure along IB-IB line illustrated in FIG. 1.

FIG. 2 illustrates a sectional structure along IA-IA line of the display unit illustrated in FIG. 1. FIG. 3 illustrates a sectional structure along IB-IB line of the display unit illustrated in FIG. 1. The display unit 1 is configured by bonding a second substrate (an opposing substrate, a sealing substrate) 20 on a first substrate (a element substrate) 11 with the organic EL elements in between, and is a top emission display unit emitting light that has passed through the second substrate 20.

A circuit layer 12 provided with a pixel circuit that includes a thin film transistor (TFT) is provided on the first substrate 11 of the display unit 1, and a surface of the circuit layer 12 is covered with a planarizing film 13 (correlation insulating film). A first electrode (for example, an anode) 14 of the organic EL element is provided on the planarizing film 13. The first electrode 14 is electrically connected to the TFT provided in the circuit layer 12. An organic insulating film 15 (a pixel separation film), an organic layer 16 including a light emitting layer, a second electrode 17, and a protection film 18 are provided in order on the first electrode 14. A seal layer 19A and a filler layer 19B are provided as a sealing layer on the protection film 18, and the second substrate 20 is bonded thereto.

A configuration of each section of the display unit 1 is described below.

The first substrate 11 may be configured of, for example, glass, silicon, a resin, or the like.

The circuit layer 12 includes the TFT, and the TFT may be configured of, for example, a bottom-gate metal oxide semiconductor field effect transistor (MOSFET). The TFT may be configured of crystalline silicon, amorphous silicon, or the like, or may be configured of an oxide semiconductor.

The planarizing film 13 planarizes the surface of the circuit layer 12 to make the film thickness of each layer of the organic EL element formed thereon uniform. Examples of a material of the planarizing film 13 may include an organic insulating film made of a polyimide resin, an acrylic resin, a novolak resin, or the like. Alternatively, as the material of the planarizing film 13, for example, an inorganic material such as a silicon oxide ($SiO_2$), silicon nitride (SiNx), and silicon oxynitride (SiON) may be used.

The first electrode 14 of the organic EL element is electrically separated for each pixel, and may have, for example, light reflection property. Examples of a material of the first electrode 14 may include a simple substance of a metal element such as chromium (Cr), gold (Au), platinum (Pt), nickel (Ni), copper (Cu), molybdenum (Mo), tungsten (W), titanium (Ti), tantalum (Ta), and silver (Ag), and an alloy thereof.

The organic insulating film 15 electrically separates the first electrode 14 for each pixel, and secures insulating property between the first electrode 14 and the second electrode 17. The organic insulating film 15 has an opening for each pixel P, and forms a light emitting region of the organic EL element. The organic insulating film 15 may be formed of, for example, an organic insulating material such as a photosensitive resin. The organic insulating film 15 is so provided on the display region 1A and the bezel region 1B as to cover the peripheral circuits, and has a separation groove (a separation groove 15A) in the bezel region 1B. Moreover, the organic insulating film 15 is selectively removed in an outermost peripheral region of the bezel region 1B. A width of the separation groove 15A may be, for example, about 10 μm or larger and about 100 μm or lower, and a distance between an end 15e of the organic insulating film 15 and an end e1 of the first substrate 11 (a width of a part where the organic insulating film 15 is removed) may be, for example, about 100 μm or larger and about 200 μm or lower.

The organic layer 16 includes a light emitting layer (an organic electroluminescence layer). Here, the organic layer 16 includes a white light emitting layer common to the organic EL elements. Incidentally, the organic layer 16 may include, for example, a hole transport layer (HTL), a hole injection layer (HIL), and an electron transport layer (ETL), in addition to the light emitting layer. Moreover, for example, an electron injection layer (EIL) such as LiF may be provided between the organic layer 16 and the second electrode 17. The organic layer 16 is so formed as to cover the display region 1A and a part of the bezel region 1B, but is so formed as not to overlap with the separation groove 15A.

The second electrode 17 has a light transmission property, is common to the organic EL elements (the pixels), and covers the display region 1A. The second electrode 17 may desirably include a transparent conductive film made of, for example, ITO, IZO, or ZnO. The second electrode 17 is electrically connected to a wiring layer on the first electrode 11 through the cathode contact part 17C. The second electrode 17 extends, continuously in a plan view, to the end e1 of the first substrate 11 in a region except for the terminal part 1C on the first substrate 11, and is so configured as to be electrically disconnected from an exterior member (an exterior frame 24) of the display panel 10.

In the first embodiment, the second electrode 17 is substantially uniformly formed to cover the entire surface except for the terminal part 1C. The second electrode 17 covers the separation groove 15A, the cathode contact part 17C, the organic insulating film 15, and the end 15e thereof. Moreover, an end surface protection film 21 (an insulating film) is provided on an end surface of the display panel 10 to cover the end 17e of the second electrode 17. Here, for example, in a plan view, the terminal part 1C may be provided in a region corresponding to one side of the rectangular display panel 10 (the first substrate 11), and the end surface protection film 21 may be provided on ends (end surfaces) corresponding to three sides except for the one side provided with the terminal part 1C. Incidentally, as illustrated in FIG. 3, a part (a separation groove 15B) where the organic insulating film 15 and the planarizing film 13 are selectively removed is provided outside the separation groove 15A in the region provided with the terminal part 1C on the first substrate 11.

Figure 4:
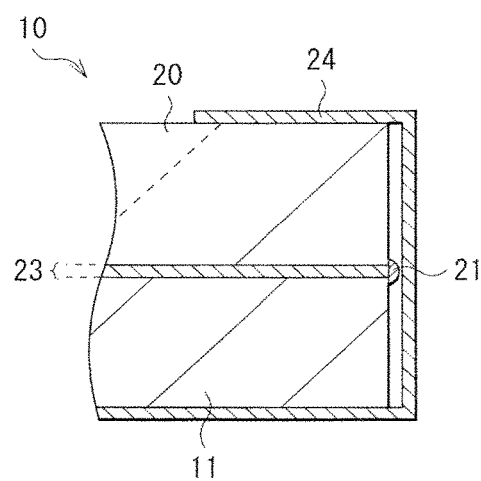
FIG. 4 is a sectional diagram illustrating a state where the display unit illustrated in FIG. 1 is mounted on an exterior frame.

FIG. 4 illustrates a state where the display panel 10 is mounted on the exterior frame 24. In this way, the end surface protection film 21 is provided to cover an end of an element layer 23 in the structure in which the element layer 23 including the above-described organic EL element is sealed between the first substrate 11 and the second substrate 20. The exterior frame 24 may be formed of, for example, a metal, and is so attached as to cover the end of the display panel 10. The exterior frame 24 is not in contact with the element layer 23 including the second electrode 17, by the end surface protection film 21.

The cathode contact part 17C is provided in a region of the bezel region 1B corresponding to the separation groove 15C. In the selective region on the cathode contact part 17C, the planarizing film 13 is removed. A width of the cathode contact part 17C is set based on a cathode current amount corresponding to the size of the display unit 1 and a contact resistance of the contact electrode.

The protection film 18 is so provided on the second electrode 17 as to cover the entire surface of the display region 1A and the bezel region 1B (except for the terminal part 1C). The protection film 18 may be formed of, for example, an inorganic material such as silicon oxide (SiOx), silicon nitride (SiNx), a silicon oxynitride (SiNxOy), titanium oxide (TiOx), and aluminum oxide (AlxOy).

Here, since the separation groove 15A and the end 15e of the organic insulating film 15 are covered with the second electrode 17 and the protection film 18, it is possible to suppress moisture infiltration from the outside of the display panel 10 and to prevent infiltration of moisture to the organic layer 16, as compared with a case where the separation groove 15A and the end 15e of the organic insulating film 15 are covered with only the protection film 18. Therefore, it is possible to improve reliability while suppressing degradation of the organic EL element.

The seal layer 19A is provided in the bezel region 1B on the first substrate 11, and may be formed of, for example, an epoxy resin or an acrylic resin. The filler layer 19B is provided in a region surrounded by the seal layer 19A, and functions as an adhesive layer. The filler layer 19B may be formed of, for example, an epoxy resin or an acrylic resin.

The second substrate 20 may be formed of, for example, glass, and a color filter and a light shielding layer (both not illustrated) may be provided in the display region 1A of the second substrate 20. The light shielding layer is provided also in the bezel region 1B.

The end surface protection film 21 is configured of an inorganic insulating film, an organic insulating film, or a stacked layer film thereof. Examples of the inorganic insulating film may include a silicon oxide, a silicon nitride, a silicon oxynitride, a titanium oxide, and an aluminum oxide. Examples of the organic insulating film may include an epoxy resin and acrylic resin.

[Manufacturing Method]

The above-described display unit 1 may be manufactured in the following manner, for example. First, after the circuit layer 12 and the planarizing film 13 are formed on the first substrate 11, the first electrode 14, the organic insulating film 15, the organic layer 16, and the second electrode 17 are formed in order on the planarizing film 13.

Figure 5A:
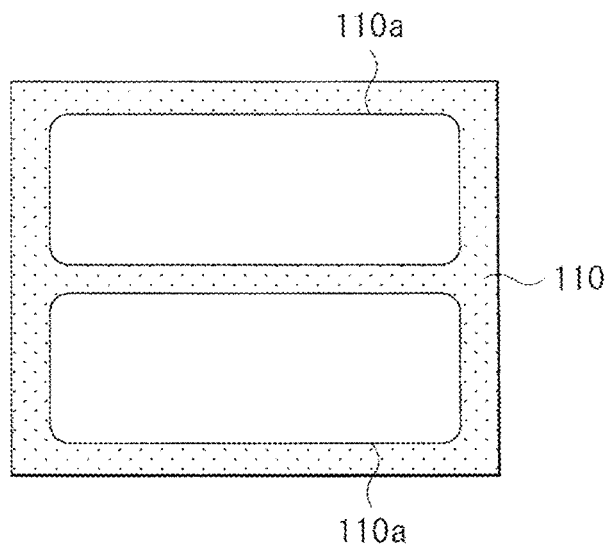
FIG. 5A is a plan view illustrating a structure of an area mask used in a step of forming a second electrode of the display unit illustrated in FIG. 1.
Figure 5B:
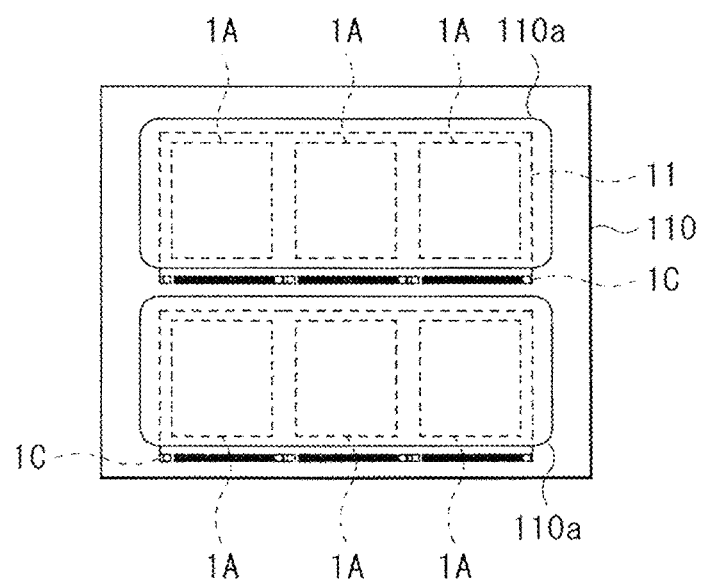
FIG. 5B is a plan view illustrating a state where the area mask that is used in the step of forming the second electrode of the display unit illustrated in FIG. 1 is disposed on a first substrate.
Figure 6:
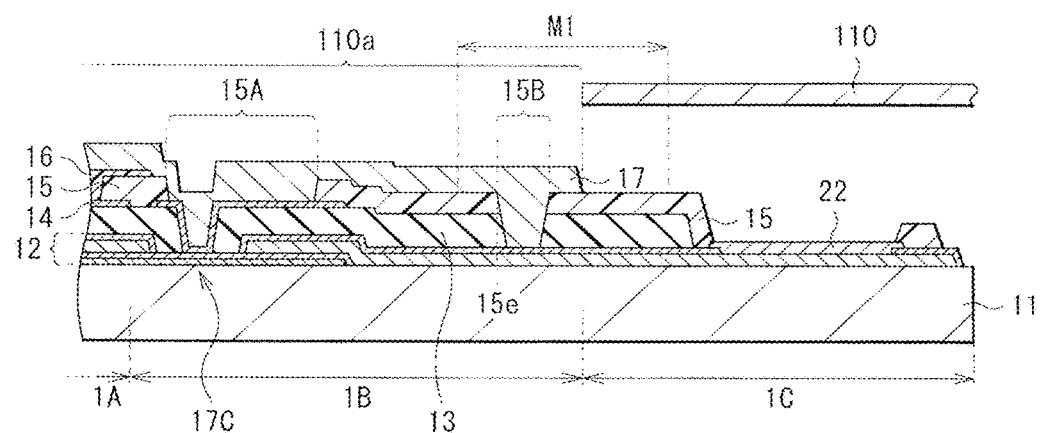
FIG. 6 is a diagram illustrating a sectional structure near a terminal part in the step of forming the second electrode.
Figure 7:
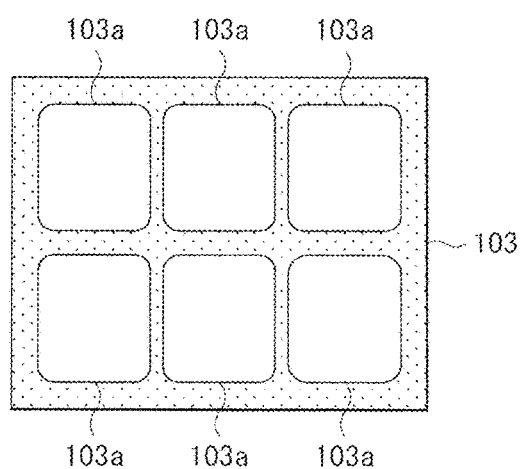
FIG. 7 is a plan view illustrating a structure of an area mask used in a step of forming a second electrode of a display unit according to comparative example 1.

Here, to form the second electrode 17, a film may be formed by, for example, a sputtering method with use of a mask 110 (a film formation mask, an area mask) having openings 110a, for example, as illustrated in FIG. 5A. The mask 110 is a so-called multiple-production mask that allows film formation over a region including the plurality of display regions 110 at a time. In the first embodiment, as illustrated in FIG. 5B, the openings 110a of the mask 110 are disposed over the entire region of the first substrate 11 except for the terminal part 1C. In other words, as also illustrated in FIG. 6, the second electrode 17 is formed while only the terminal part 1C is selectively masked. Therefore, in the region on the first substrate 11 corresponding to the terminal part 1C, a film formation margin M1 may be preferably secured in consideration of misalignment of the position of the mask 110. For example, when a space for formation of peripheral circuits and the like is secured in the terminal part 1C, the film formation margin M1 may be preferably secured in the terminal part 1C. In addition, when the plurality of (three in this case) display regions 1A are disposed along one direction on the first substrate 11, one opening 110a is disposed with respect to the plurality of display regions 1A. Specifically, the plurality of display regions 1A are disposed so that the regions of the respective bezel regions 1B except for the respective terminal parts 1C are adjacent to one another, and the mask 110 that has the opening 110a larger than an opening 103a of a mask 103 in a comparative example 1 illustrated in FIG. 7 is used.

Figure 8:
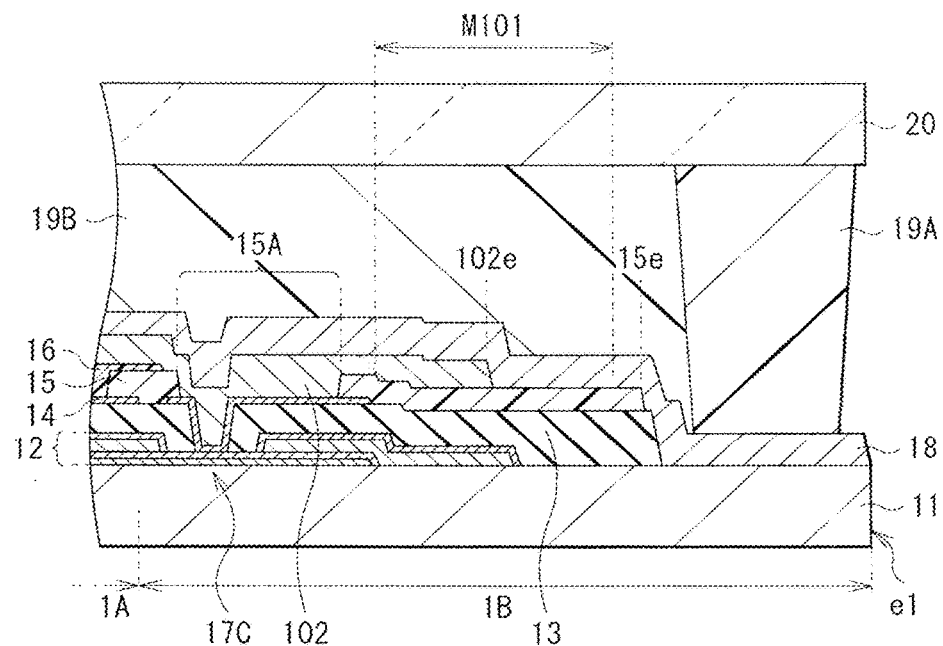
FIG. 8 is a sectional diagram illustrating a structure of the display unit fabricated with use of the area mask illustrated in FIG. 7.

By film formation with use of such a mask 110, the second electrode 17 is formed to uniformly extend to the end e1 of the first substrate 11 (is formed to be exposed to the end e1 of the first substrate 11) in the region except for the terminal part 1C. In addition, when the second electrode is formed with use of the mask 103 according to the comparative example, the opening 103a is disposed for each display region. Therefore, as illustrated in FIG. 8, a film formation margin M101 may be desirably secured in a region between the separation groove 15A and the end 15e in the bezel region 101B even in the region other than the terminal part. Accordingly, it is difficult to reduce the size of the bezel region 101B. In contrast, in the first embodiment, it is unnecessary to use the mask 103 as in the comparative example 1, and it is possible to form the second electrode 17 without considering the film formation margin by the mask in the region except for the terminal part 1C. Accordingly, it is possible to achieve reduction in size of the bezel region 1B. Moreover, since the terminal part 1C is exposed without etching step, it is possible to simplify the process and to enhance working easiness and strength of the mask 110.

Here, a transparent conductive film such as ITO may be desirably used as the second electrode 17. The transparent conductive film is difficult to be deteriorated by moisture. Therefore, even in the case where the second electrode 17 is extended to the end e1 of the first substrate 11, infiltration of moisture to the organic layer 16 is suppressed to improve reliability. This is advantageous in reduction of the size of the bezel region 1B. If the second electrode 17 is formed of a metal that is easily deteriorated by moisture, such as magnesium (Mg), calcium (Ca), and sodium (Na), or an alloy thereof, it is concerned that reliability is deteriorated by moisture infiltration to the organic layer 16. Therefore, as with the comparative example 1, the second electrode 17 may be desirably formed with use of the mask (FIG. 7) having the opening for each display region, and as a result, it is necessary to secure the film formation margin M101 (FIG. 8). In addition, it is necessary to secure the sufficiently large width of the contact part between the second electrode 17 and the cathode contact part 17C in consideration of the film formation margin M101. Therefore, it is necessary to secure the wide bezel region 101B, and thus it is difficult to achieve reduction in size of the bezel, reduction in size of the display unit, or reduction in cost of the display unit.

After the formation of the second electrode 17 as described above, the protection film 18 is formed and the second substrate 20 is bonded thereon with the seal layer 19A and the filler layer 19B in between. After that, the first substrate 11 and the second substrate 20 that have been bonded to each other are scribed and broken to be divided into the plurality of display panels 10. At this time, in the bezel region 1B of the display panel 10 except for the terminal part 1C, division is performed at the position not overlapping with the end 15e of the organic insulating film 15. On the other hand, in the terminal part 1C of the first substrate 11, the division is performed while the scribing position of the first substrate 11 and the scribing position of the second substrate 20 are shifted from each other so that the terminal 22 is exposed. Subsequently, the protection film 18 formed on the terminal part 1C is removed by etching to expose the terminal part 1C. Finally, the end surface protection film 21 is so formed on the end e1 of the first substrate 11 as to cover the end 17e of the second electrode 17. In this way, the display unit 1 is completed.

[Function and Effects]

In the display unit 1 according to the first embodiment, the second electrode 17 extends, continuously in a plan view, to the end e1 of the first substrate 11 in the region on the first substrate 11 except for the terminal part 1C. Specifically, in the manufacturing process, the second electrode 17 is formed without using the area mask having the openings disposed for the respective display regions or with use of the mask 110 that has the openings 110a and selectively shields only the terminal part 1C. Therefore, in the bezel region 1B except for the terminal part 1C, it is unnecessary to secure the film formation margin in consideration of misalignment of the position of the mask openings in the formation of the second electrode 17.

Figure 9:
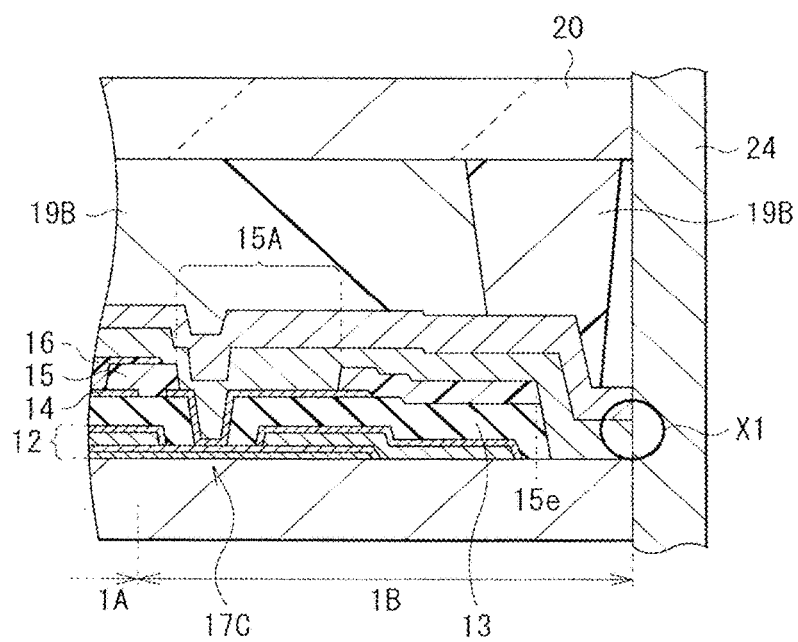
FIG. 9 is a sectional diagram illustrating a structure of a display unit according to comparative example 2.

On the other hand, the second electrode 17 extends to the end of the first substrate 11, which may cause the second electrode 17 to contact with the metal exterior frame 24, for example, as with a comparative example 2 illustrated in FIG. 9, and thus occurrence of electrical short circuit X1 is concerned. This may cause degradation of yield. In contrast, in the first embodiment, the end 17e of the second electrode 17 is so configured as to be electrically disconnected from the exterior frame 24 of the display panel 10. Specifically, the end 17e of the second electrode 17 is covered with the end surface protection film 21. Therefore, short circuit X1 as in the comparative example 2 is difficult to occur after the display panel 10 is mounted on the exterior frame 24. Therefore, in the bezel region 1B of the first substrate 11, it is possible to form the second electrode 17 without securing the film formation margin in the formation of the second electrode 17, and thus the bezel region 1B is reduced in size.

As described above, in the first embodiment, in the bezel region 1B except for the terminal part 1C, the second electrode 17 extends to the end e1 of the first substrate 11, which eliminates necessity of securing of the film formation margin in the formation of the second electrode 17, and it is accordingly possible to reduce in size of the bezel region 1B. Moreover, this causes downsizing and reduction in cost. Further, the end 17e of the second electrode 17 is covered with the end surface protection film 21, which makes it possible to suppress occurrence of electrical short circuit after the display panel 10 is mounted on the exterior frame 24. As a result, it is possible to suppress degradation of yield while reducing the size of the bezel.

Next, other embodiments and modifications of the disclosure are described. In the following description, like numerals are used to designate substantially like components of the above-described first embodiment, and the description thereof is appropriately omitted.

<Second Embodiment>

Figure 10:
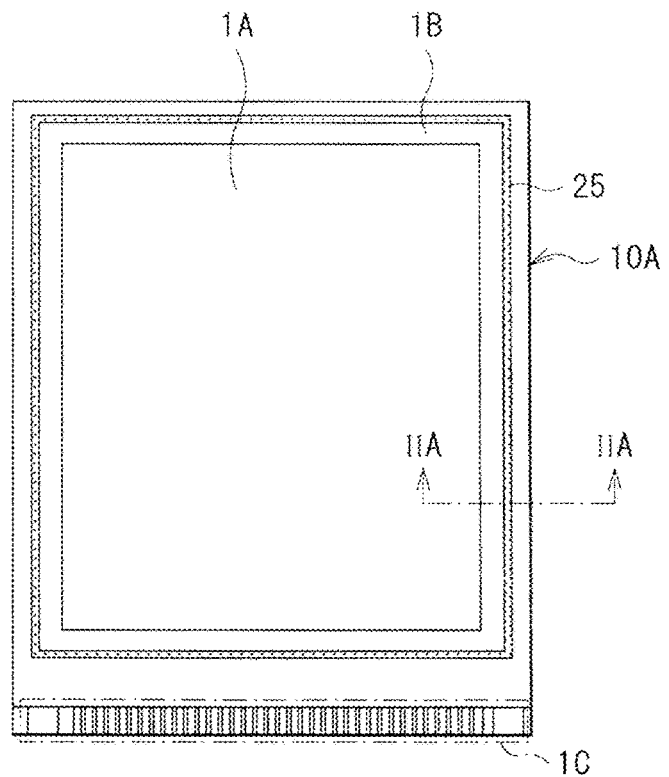
FIG. 10 is a plan view illustrating a configuration of a display unit according to a second embodiment of the disclosure.

FIG. 10 illustrates a planar configuration of a display unit according to a second embodiment of the disclosure. The display unit may be, for example, an organic EL display unit similarly to the above-described first embodiment, and may include, for example, a display panel (a display panel 10A) including a plurality of pixels (sub-pixels) P that are arranged in matrix, in the display region 1A on the first substrate 11. Moreover, the display unit is configured by bonding the second substrate 20 to the first substrate 11 with the organic EL elements in between, and is a top-emission display unit emitting light that has passed through the second substrate 20. A signal line drive circuit, a scan line drive circuit, a power line drive circuit, and the like that are used to drive the pixels P are provided in the bezel region 1B of the display region 1A. The terminal part 1C is provided on a part of the bezel region 1B.

Figure 11:
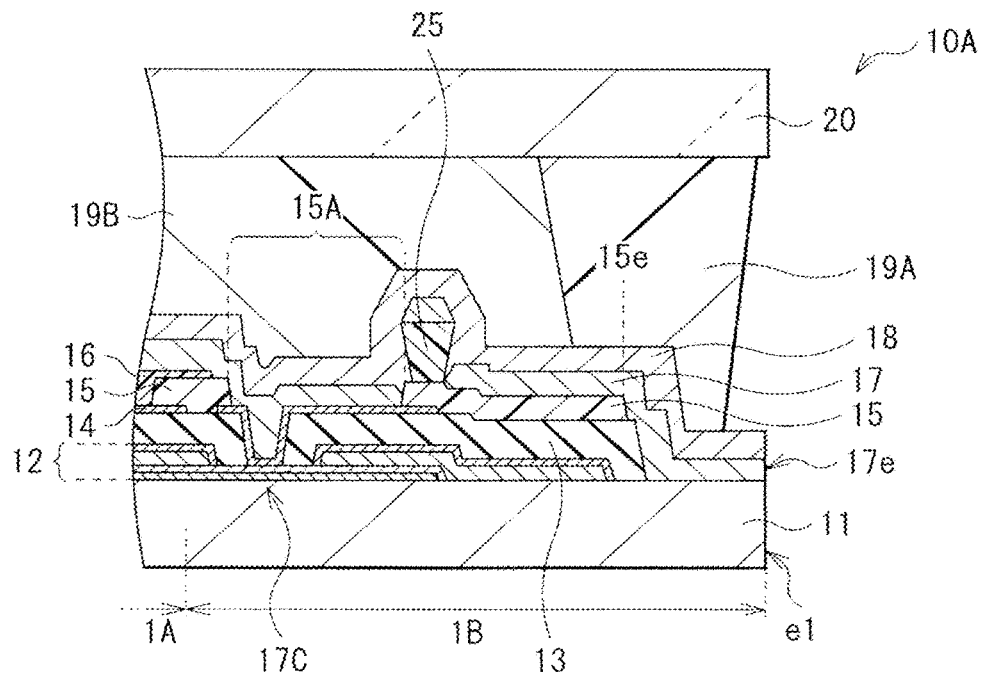
FIG. 11 is a diagram illustrating a sectional structure along IIA-IIA line illustrated in FIG. 10.

FIG. 11 illustrates a sectional structure along IIA-IIA line of the display unit illustrated in FIG. 10. Similar to the display panel 10 in the above-described first embodiment, also in the display panel 10A, the circuit layer 12 including TFTs is provided on the first substrate 11, and the surface thereof is covered with the planarizing film 13. The first electrode 14 of the organic EL element is provided on the planarizing film 13, and the organic insulating film 15, the organic layer 16, the second electrode 17, and the protection film 18 are provided in order on the first electrode 14. The seal layer 19A and the filler layer 19B are provided on the protection film 18, and the second substrate 20 is bonded thereto. In such a structure, the second electrode 17 is formed to extend, continuously in a plan view, to the end e1 of the first substrate 11. In addition, the end 17e of the second electrode 17 is so configured as to be electrically disconnected from the exterior frame 24 (not illustrated in FIG. 11).

However, in the second embodiment, a structure having an inverse-tapered shape (an inverse-tapered structure 25) is disposed on a lower layer of the second electrode 17. Here, the inverse-tapered structure 25 is disposed to be adjacent to the lower surface of the second electrode 17. The second electrode 17 extends, continuously in a plan view, from the display region 1A to the end e1 of the first substrate 11, but is electrically discontinuous by the inverse-tapered structure 25. Specifically, in the second electrode 17, a part (the display region 1A side) inside the formation position of the inverse-tapered structure 25 is electrically separated from a part outside the formation position of the inverse-tapered structure 25.

The inverse-tapered structure 25 is so disposed in the bezel region 1B as to surround the display region 1A. The inverse-tapered structure 25 may be formed of, for example, a photosensitive resin such as photoresist.

In the second embodiment, after the formation of the inverse-tapered structure 25, the second electrode 17 is formed in a manner similar to the above-described first embodiment, namely, without using the area mask 103 as illustrated in FIG. 7. As a result, in the second electrode 17, the part inside the inverse-tapered structure 25 and the part outside the inverse-tapered structure 25 are electrically separated from each other. Accordingly, when the end 17e of the second electrode 17 is in contact with the exterior frame after mounting, it is possible to prevent occurrence of electrical short circuit. Consequently, it is possible to obtain effects equivalent to those in the above-described first embodiment.

<Third Embodiment>

Figure 12:
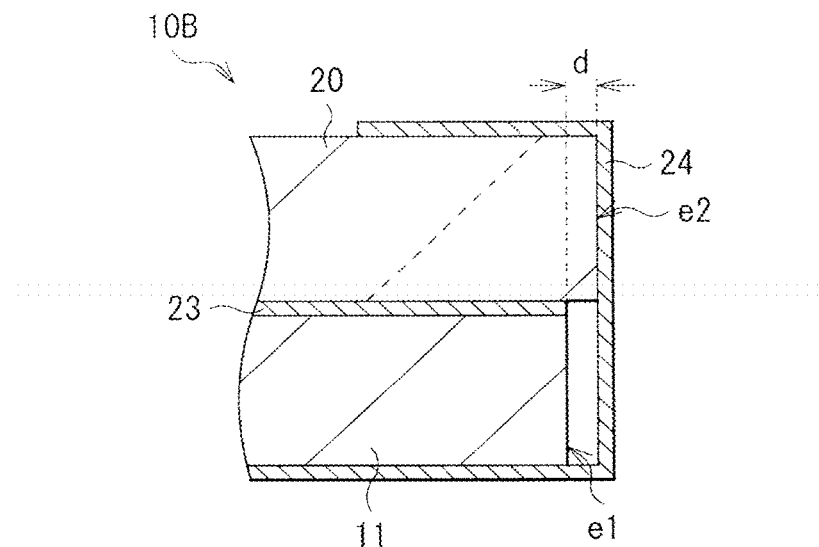
FIG. 12 is a sectional diagram illustrating a structure of a display unit according to a third embodiment of the disclosure.

FIG. 12 illustrates a sectional structure of a display unit according to a third embodiment of the disclosure together with the exterior frame 24. The display unit may be, for example, an organic EL display unit similarly to the above-described first embodiment, and although not illustrated in particular, the display unit includes a display panel (a display panel 10B) that includes a plurality of pixels (sub-pixels) P arranged in matrix, in the display region 1A on the first substrate 11. Moreover, the display unit is configured by bonding the second substrate 20 to the first substrate 11 with the organic EL elements (the element layer 23) in between, and is a top emission display unit emitting light that has passed through the second substrate 20. A signal line drive circuit, a scan line drive circuit, a power line drive circuit, and the like that are used to drive the pixels P are provided in the bezel region 1B of the display region 1A. The terminal part 1C is provided in a part of the bezel region 1B. Also, in the display panel 10B, the second electrode 17 of the element layer 23 is formed to extend, continuously in a plan view, to the end e1 of the first substrate 11, similarly to the display panel 10 according to the above-described first embodiment. Further, the end 17e of the second electrode 17 is so configured as to be electrically disconnected from the exterior frame 24.

Incidentally, in the third embodiment, the second electrode 17 is disposed inside the outermost end of one or both of the first substrate 11 and the second substrate 20. Specifically, for example, in a region except for the terminal part 1C, an end e2 (the outermost end) of the second substrate 20 is so disposed as to overhang from the end e1 of the first substrate 11 by a width d. In the manufacturing process, at the time of performing scribing and breaking after the first substrate 11 and the second substrate 20 are bonded to each other, a scribing position and a breaking position are set so that the second substrate 20 has an outer shape larger than that of the first substrate 11 in the region except for the terminal part 1C. As a result, the end 17e of the second electrode 17 is disposed inside the outermost end of the display panel 10B. Thus, the end e2 of the second substrate 20 is in contact with the exterior frame 24 after mounting, and the end 17e of the second electrode 17 located inside the end e2 of the second substrate 20 is not in contact with the exterior frame 24. Accordingly, it is possible to prevent occurrence of electrical short circuit. Consequently, it is possible to obtain effects equivalent to those in the above-described first embodiment.

<Modifications>

Figure 13A:
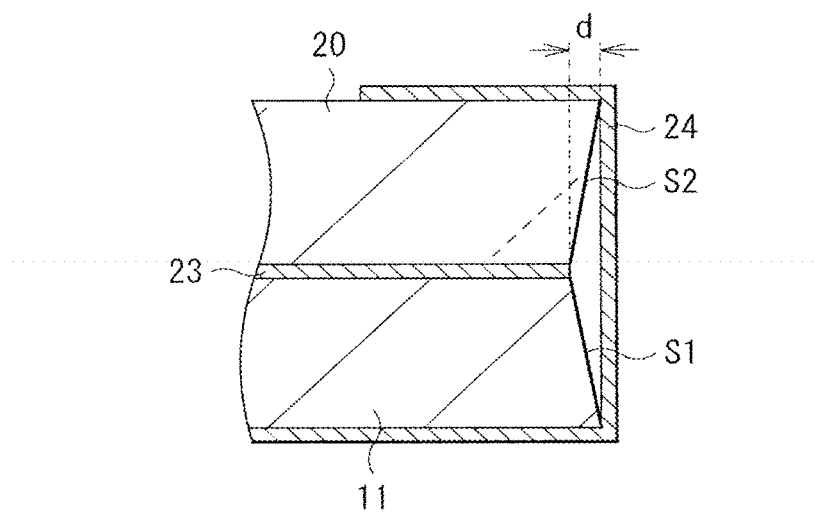
FIG. 13A is a sectional diagram illustrating a structure example of a display unit according to a modification.
Figure 13B:
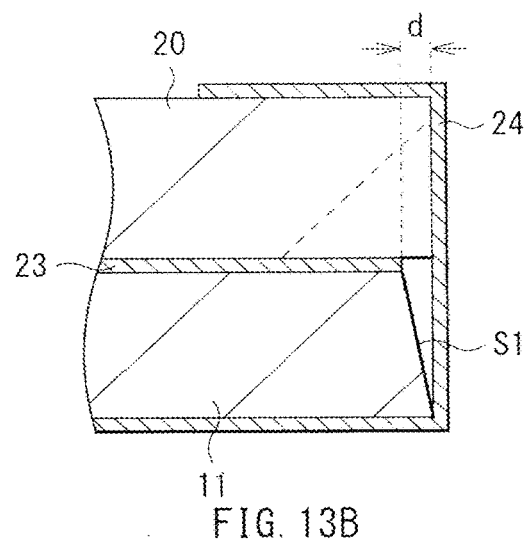
FIG. 13B is a sectional diagram illustrating a structure example of a display unit according to another modification.
Figure 13C:
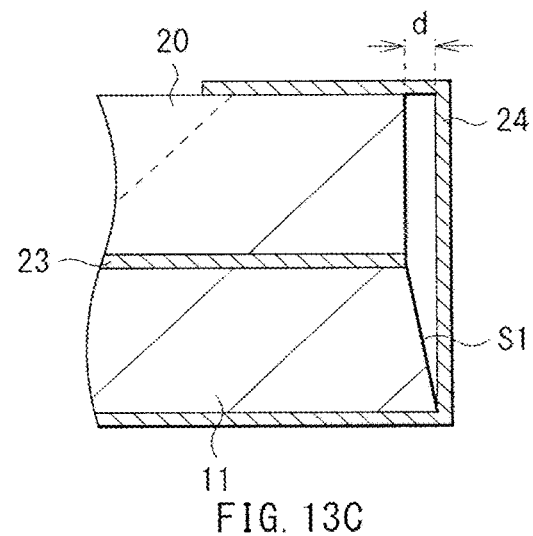
FIG. 13C is a sectional diagram illustrating a structure example of a display unit according to still another modification.
Figure 13D:
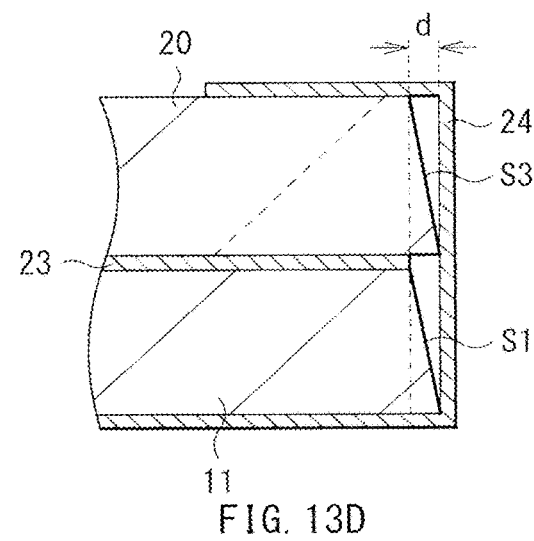
FIG. 13D is a sectional diagram illustrating a structure example of a display unit according to still another modification.
Figure 14:
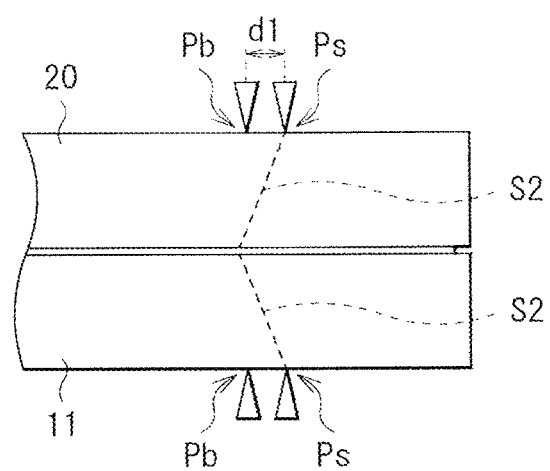
FIG. 14 is a schematic diagram for explaining a method of fabricating the display unit illustrated in FIG. 13A.

Incidentally, the display panel in which the second electrode 17 is disposed inside the outermost end of one or both of the first substrate 11 and the second substrate 20 is not limited to the display panel 10B according to the above-described third embodiment. For example, as illustrated in FIG. 13A to FIG. 13D, one or both of the first substrate 11 and the second substrate 20 may each have a tapered end surface. Specifically, as illustrated in FIG. 13A and FIG. 13D, both an end surface S1 of the first substrate 11 and an end surface S2 of the second substrate 20 may have a tapered shape. Alternatively, as illustrated in FIG. 13B and FIG. 13C, only the end surface S1 of the first substrate 11 may have a tapered shape. Note that the tapered shape as described above may be formed by shifting the scribing position and the breaking position. A distance dl between the scribing position and the breaking position may be desirably set to about 10 μm or larger and about 100 μm or lower. For example, the tapered shape illustrated in FIG. 13A may be formed by setting a scribing position Ps and a breaking position Pb as schematically illustrated in FIG. 14.

<Application Examples>

The display units described in the above-described embodiments and the modifications are applicable to electronic apparatuses in every field that display externally input picture signal or internally generated picture signal as a picture. Examples thereof are described below.

Figure 15A:
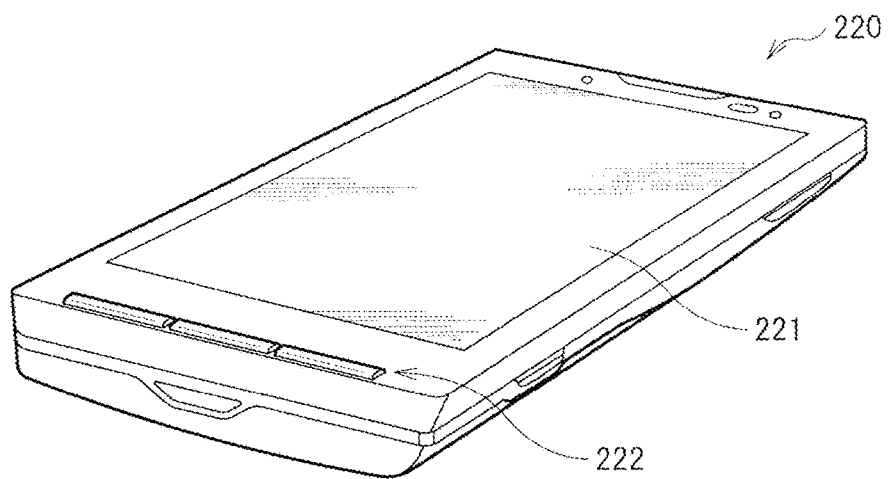
FIG. 15A is a perspective view illustrating a configuration of a smartphone.
Figure 15B:
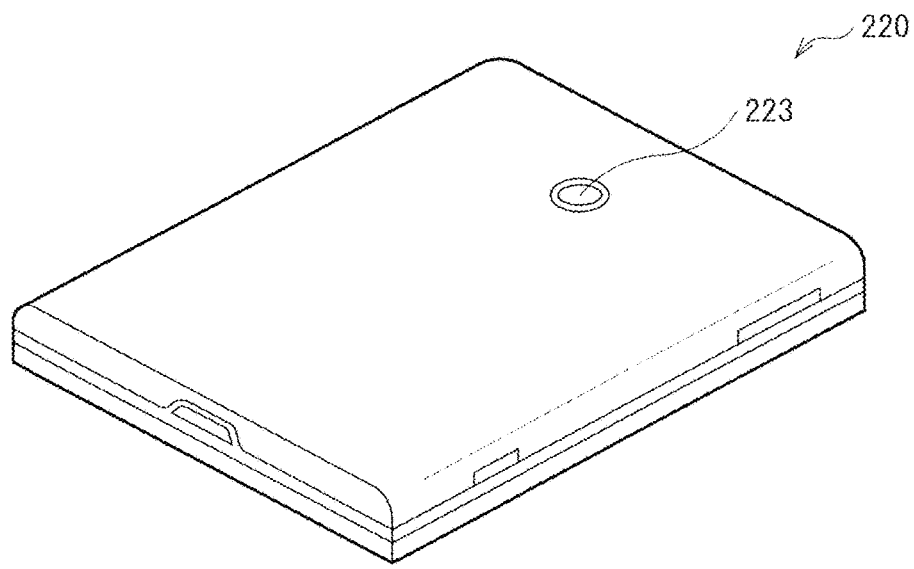
FIG. 15B is a perspective view illustrating the configuration of the smartphone.

FIG. 15A and FIG. 15B each illustrate an appearance of a smartphone 220. The smartphone 220 may include, for example, a display section 221 and an operation section 222 on front side, and a camera 223 on back side, and the display unit according to any of the above-described embodiments and the like is mounted on the display section 221.

Figure 16A:
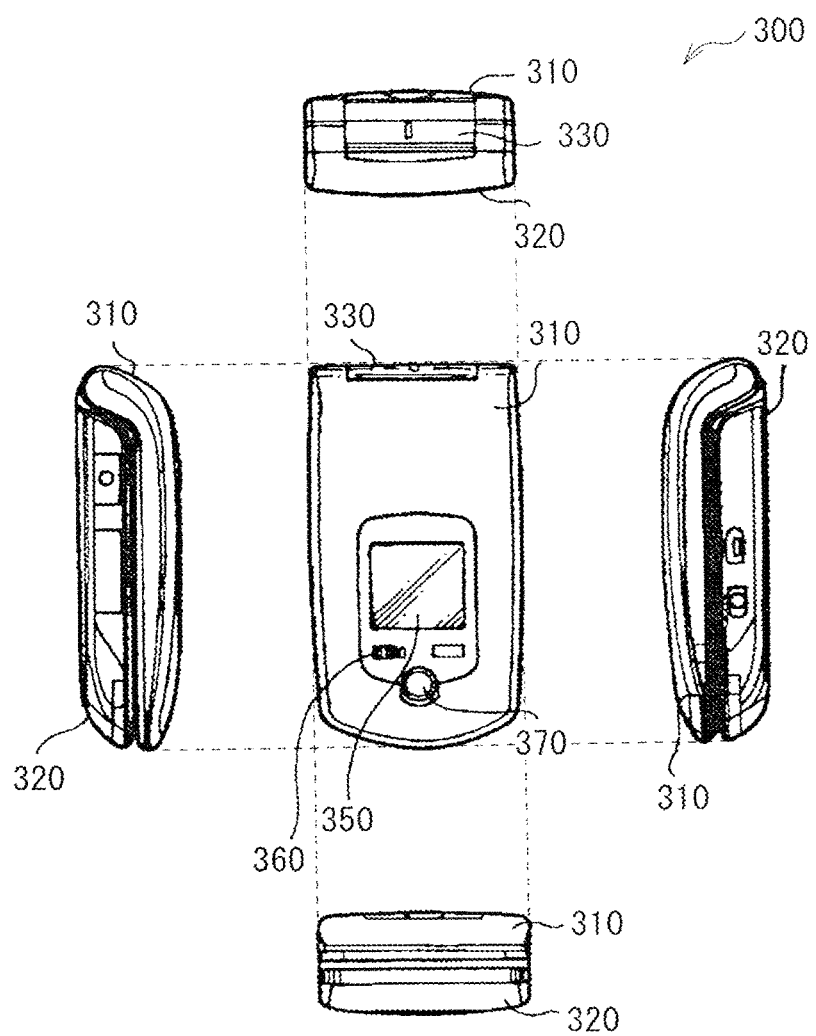
FIG. 16A is a diagram illustrating an appearance of a mobile phone.
Figure 16B:
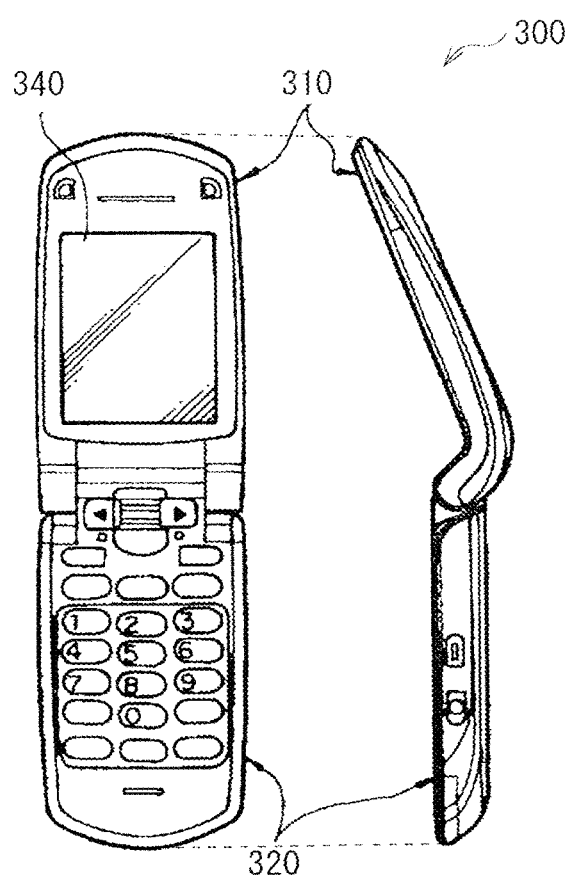
FIG. 16B is a diagram illustrating the appearance of the mobile phone.

FIG. 16A and FIG. 16B each illustrate an appearance of a mobile phone 300. The mobile phone may be configured by, for example, coupling an upper housing 310 and a lower housing 320 with a coupling section (a hinge section) 330, and may include a display 340, a sub-display 350, a picture light 360, and a camera 370. The display unit according to any of the above-described embodiments and the like is mounted on the display 340 or the sub-display 350.

Hereinbefore, although the disclosure has been described with referring to the embodiments and the modifications, the disclosure is not limited to the above-described embodiments and the like, and various modifications may be made. For example, in the above-described embodiments and the like, the structure in which the terminal part 1C of the display panel is provided only in a region corresponding to one side of the bezel region 1B on the first substrate 11 has been exemplified. Alternatively, the terminal part 1C may be provided in a region corresponding to two or more sides of the bezel region 1B.

Moreover, in the above-described embodiments and the like, the case where the organic EL display unit is of the top emission type has been described. However, the organic EL display unit is not limited thereto, and the contents of the disclosure may be applicable to, for example, a structure of bottom emission type.

Further, the material and the thickness of each layer described in the above-described embodiments and the like are not limited to those described, and other material and other thickness may be employed. In addition, the display unit does not necessarily have all of the layers described above, or may include other layers in addition to the layers described above. Further, the effects described in the above-described embodiments and the like are illustrative and non-limiting. Effects achieved by the disclosure may be effects other than those described above or may further include other effects.

Note that the disclosure may be configured as follows.

(1) A display unit including a display panel including a display region and a terminal region on a first substrate, the display region including a plurality of pixels, each of the plurality of pixels including a light emitting element, and the terminal region including a plurality of terminals at a part of a peripheral region of the display region, wherein the light emitting element includes a first electrode, an organic layer, and a second electrode that is provided commonly to the plurality of pixels, in order from the first substrate side, and the second electrode extends, continuously in a plan view, to an end of the first substrate in a region on the first substrate except for the terminal region, and is configured to be electrically disconnected from an exterior member of the display panel.

(2) The display unit according to (1), wherein the second electrode is covered with an insulating film provided at the end of the first substrate.

(3) The display unit according to (2), wherein the display panel has a rectangular shape in a plan view, the terminal region corresponds to one side of the rectangular shape of the peripheral region on the first substrate, and the insulating film is provided at ends of the first substrate corresponding to three sides except for the one side.

(4) The display unit according to any one of (1) to (3), wherein an inverse-tapered structure is provided at a part of the peripheral region in a lower layer of the second electrode, and the second electrode is electrically discontinuous by the structure while being provided continuously in a plan view.

(5) The display unit according to (4), wherein the structure is provided in the peripheral region on the first substrate to surround the display region (6) The display unit according to any one of (1) to (5), wherein the display panel includes the first substrate and a second substrate that is provided oppositely to the first substrate and seals the light emitting element, and the second electrode is disposed inside an outermost end of one or both of the first substrate and the second substrate.

(7) The display unit according to (6), wherein one or both of the first substrate and the second substrate each have a tapered end surface.

(8) The display unit according to any one of (1) to (7), wherein the second electrode is a transparent conductive film.

(9) The display unit according to any one of (1) to (8), further including an organic insulating film as an interlayer insulating film or a pixel separation film, wherein the organic insulating film has a separation groove in the peripheral region, and the organic insulating film has an end disposed inside the end of the first substrate.

(10) A method of manufacturing a display unit, including:

forming a display panel including a display region and a terminal region, the display region including a plurality of pixels, each of the plurality of pixels including a light emitting element, and the terminal region including a plurality of terminals at a part of a peripheral region of the display region; and forming, as the light emitting element, a first electrode, an organic layer, and a second electrode on the first substrate, the second electrode being common to the plurality of pixels, wherein the second electrode is formed to extend, continuously in a plan view, to an end of the first substrate in a region on the first substrate except for the terminal region, and is formed to be electrically disconnected from an exterior member of the display panel.

(11) The method according to (10), wherein the second electrode is formed on the first substrate with use of a film formation mask including an opening, and the opening is provided over an entire region on the first substrate except for the terminal region.

(12) The method according to (10) or (11), wherein a plurality of the display regions are formed along one direction on the first substrate with use of a film formation mask including one opening for the plurality of display regions.

(13) The method according to any one of (10) to (12), wherein the second electrode is covered with an insulating film provided at the end of the first substrate.

(14) The method according to any one of (10) to (13), further including forming an inverse-tapered structure at a part of the peripheral region before forming the second electrode, wherein the second electrode is electrically discontinuous while being continuous in a plan view by forming the second electrode on the first substrate with the structure in between.

(15) The method according to any one of (10) to (14), wherein the display panel includes the first substrate and a second substrate that is provided oppositely to the first substrate and seals the light emitting element, and the second electrode is disposed inside an outermost end of one or both of the first substrate and the second substrate.

(16) The method according to (15), wherein one or both of the first substrate and the second substrate each have a tapered end surface.

(17) The method according to any one of (10) to (16), wherein the second electrode is a transparent conductive film.

(18) The method according to any one of (10) to (17), further including forming an organic insulating film as an interlayer insulating film or a pixel separation film, the organic insulating film including a separation groove in the peripheral region, and the organic insulating film including an end located inside the end of the first substrate.

(19) An electronic apparatus provided with a display unit, the display unit including a display panel including a display region and a terminal region on a first substrate, the display region including a plurality of pixels, each of the plurality of pixels including a light emitting element, and the terminal region being provided at a part of a peripheral region of the display region and including a plurality of terminals, wherein the light emitting element includes a first electrode, an organic layer, and a second electrode in order from the first substrate side, the second electrode being provided commonly to the plurality of pixels, and the second electrode extends, continuously in a plan view, to an end of the first substrate in a region on the first substrate except for the terminal region, and is configured to be electrically disconnected from an exterior member of the display panel.

It should be understood by those skilled in the art that various modifications, combinations, sub-combinations, and alterations may occur depending on design requirements and other factors insofar as they are within the scope of the appended claims or the equivalents thereof.

What is claimed is:

1. A method of manufacturing a display unit, comprising:
   forming a display panel including a display region and a terminal region, the display region including a plurality of pixels, each of the plurality of pixels including a light emitting element, and the terminal region including a plurality of terminals at a part of a peripheral region of the display region; and
   forming, as the light emitting element, a first electrode, an organic layer, and a second electrode on a first substrate, the second electrode being common to the plurality of pixels, wherein
   the second electrode is formed to extend, continuously in a plan view, to cover the display region and the second electrode is also formed to extend across a bezel region between the display region and an edge portion of the display panel at three sides, and the second electrode is formed to be electrically disconnected from an exterior member of the display panel.

2. The method according to claim 1, wherein
   the second electrode is formed on the first substrate with use of a film formation mask including an opening, and
   the opening is provided over an entire region on the first substrate except for the terminal region.

3. The method according to claim 1, wherein
   a plurality of the display regions are formed along one direction on the first substrate with use of a film formation mask including one opening for the plurality of display regions.

4. The method according to claim 1, wherein
   the second electrode is covered with an insulating film provided at the end of the first substrate.

5. The method according to claim 1, further comprising
   forming an inverse-tapered structure at a part of the peripheral region before forming the second electrode, wherein
   the second electrode is electrically discontinuous while being continuous in a plan view by forming the second electrode on the first substrate with the structure in between.

6. The method according to claim 1, wherein
   the display panel includes the first substrate and a second substrate that is provided oppositely to the first substrate and seals the light emitting element, and
   the second electrode is disposed inside an outermost end of one or both of the first substrate and the second substrate.

7. The method according to claim 6, wherein
   one or both of the first substrate and the second substrate each have a tapered end surface.

8. The method according to claim 6, wherein the second electrode is disposed inside the outermost end of one or both of the first substrate and the second substrate.

9. The method according to claim 1, wherein
   the second electrode is a transparent conductive film.

10. The method according to claim 1, further comprising
    forming an organic insulating film as an interlayer insulating film or a pixel separation film, the organic insulating film including a separation groove in the peripheral region, and the organic insulating film including an end located inside the end of the first substrate.

11. The method according to claim 1, wherein the second electrode is formed not to extend across the bezel region at one side where the terminal region is formed.

* * * * *